United States Patent [19]

Hazama et al.

[11] 4,206,380
[45] Jun. 3, 1980

[54] PIEZOELECTRIC SURFACE ACOUSTIC WAVE DEVICE WITH SUPPRESSION OF REFLECTED SIGNALS

[75] Inventors: Katashi Hazama, Zushi; Kentaro Hanma, Yokohama, both of Japan

[73] Assignee: Hitachi, Ltd., Japan

[21] Appl. No.: 972,215

[22] Filed: Dec. 22, 1978

[51] Int. Cl.$^2$ .......................................... H01L 41/10
[52] U.S. Cl. .................................. 310/313; 333/194; 333/196
[58] Field of Search ................ 310/313; 333/150, 151, 333/154, 193, 194, 196

[56] References Cited

U.S. PATENT DOCUMENTS

| | | | |
|---|---|---|---|
| 3,727,155 | 4/1973 | DeVries | 310/313 X |
| 3,801,937 | 4/1974 | Bristol | 310/313 X |
| 3,968,461 | 7/1976 | Mitchell et al. | 310/313 X |
| 4,023,124 | 5/1977 | Parker et al. | 310/313 X |
| 4,126,838 | 11/1978 | McCusker et al. | 310/313 X |

Primary Examiner—Mark O. Budd
Attorney, Agent, or Firm—Craig & Antonelli

[57] ABSTRACT

A surface acoustic wave device has an electrode finger structure in which the width of finger portions external of envelopes indicating a weighted overlap length and the length of the spaces existing between adjacent finger portions measured widthwise thereof are substantially equal to one half of the wavelength of the acoustic surface wave, the envelopes are symmetric about the center line of a propagation path for the surface acoustic wave, and the finger portions and the spaces between the finger portions are in opposite positional relation to each other about the center line of the propagation path. With this electrode finger structure, occurrence of disturbing reflected signal at the weighted interdigital electrode, which is used as an input/output electrode of the surface acoustic wave device and occurrence of wavefront distortion are prevented and production yield of the device is improved.

2 Claims, 4 Drawing Figures

PIEZOELECTRIC SURFACE ACOUSTIC WAVE DEVICE WITH SUPPRESSION OF REFLECTED SIGNALS

BACKGROUND OF THE INVENTION

1. Field of the Invention

The present invention relates to a surface acoustic wave device having a structure which suppresses a wavefront distortion and a disturbing reflected signal produced in an interdigital transducer having a pair of comb-like electrode fingers overlapped with each other and arranged on a piezoelectric substrate.

2. Description of the Prior Art

As shown in FIG. 1, a surface acoustic wave device generally comprises a piezoelectric substrate 1, an input interdigital transducer 2 having a pair of comb-like electrode fingers overlapped with each other for converting an electric signal to a surface acoustic wave, a propagation path 3 along which the surface acoustic wave propagates and an output interdigital transducer 4 having a similar structure to that of the input interdigital transducer 2 for converting the propagated surface acoustic wave to an electric signal. In such a surface acoustic wave device, in order to attain a complex frequency characteristic, the input interdigital transducer 2 and/or the output interdigital transducer 4 is weighted in terms of the overlap length of the two comb-like electrode fingers as shown in FIG. 2. The resulting envelopes denoted by 5a and 5b created by the weighting should be in accordance with a Fourier transform of a desired frequency characteristic. In the interdigital transducer weighted as shown in FIG. 2, it is a common practice to provide dummy electrodes 6 externally of the envelopes 5a and 5b in order to eliminate wavefront distortion of the propageted surface acoustic wave, as is disclosed in U.S. Pat. No. 3,699,364.

Furthermore, in order to eliminate the reflection at the electrode fingers, a split-connected interdigital transducer as shown in U.S. Pat. No. 3,727,155 or an unbalanced double electrode described in an article in "1976 Ultrasonics Symposium Proceedings" by K. Hanma, who is one of the inventors of the present invention, is used. The former interdigital transducer has an electrode finger width equal to $\lambda/8$, where $\lambda$ is the wavelength of the surface acoustic wave and the latter interdigital transducer has electrode finger widths equal to $\lambda/16$ and $3\lambda/16$. Thus, when the interdigital transudcer is used as a 50 MHz television intermediate frequency filter, a very narrow electrode of 10 $\mu$m or less is required. This has been a cause for poor yield of the device. Furthermore, because of very narrow electrode fingers, the breakage of electrode fingers occurs and the wavefront distortion of the surface acoustic wave occurs because the ratio of the width of the electrode finger external of the envelopes and the gap at which no electrode is disposed is not uniform.

SUMMARY OF THE INVENTION

It is an object of the present invention to provide a surface acoustic wave device having a weighted overlap length of electrode fingers which overcomes the prior art problems of the wavefront distortion of the surface acoustic wave, the disturbing reflected signal at the electrode fingers and the poor production yield of the surface acoustic wave device.

In order to achieve the above object, in accordance with the present invention, there is provided a surface acoustic wave device having an electrode structure in which each comb-like electrode finger includes a first finger portion and a second finger portion, the lengths of the first and second finger portions defining envelopes to provide a weighted overlap length, the width of the first finger portions external of the envelopes and the distance between the first finger portions are approximately equal to one half of the wavelength of the surface acoustic wave, the envelopes are vertically symmetric around the center line of the propagation path for the surface acoustic wave, and the electrode finger and the space between the electrode fingers above the center line of the propagation path are in opposite positional relation to those below the center line.

DESCRIPTION OF THE PREFERRED EMBODIMENTS

Referring to the accompanying drawings a preferred embodiment of the surface acoustic wave device of the present invention will now be explained.

Figure 3:
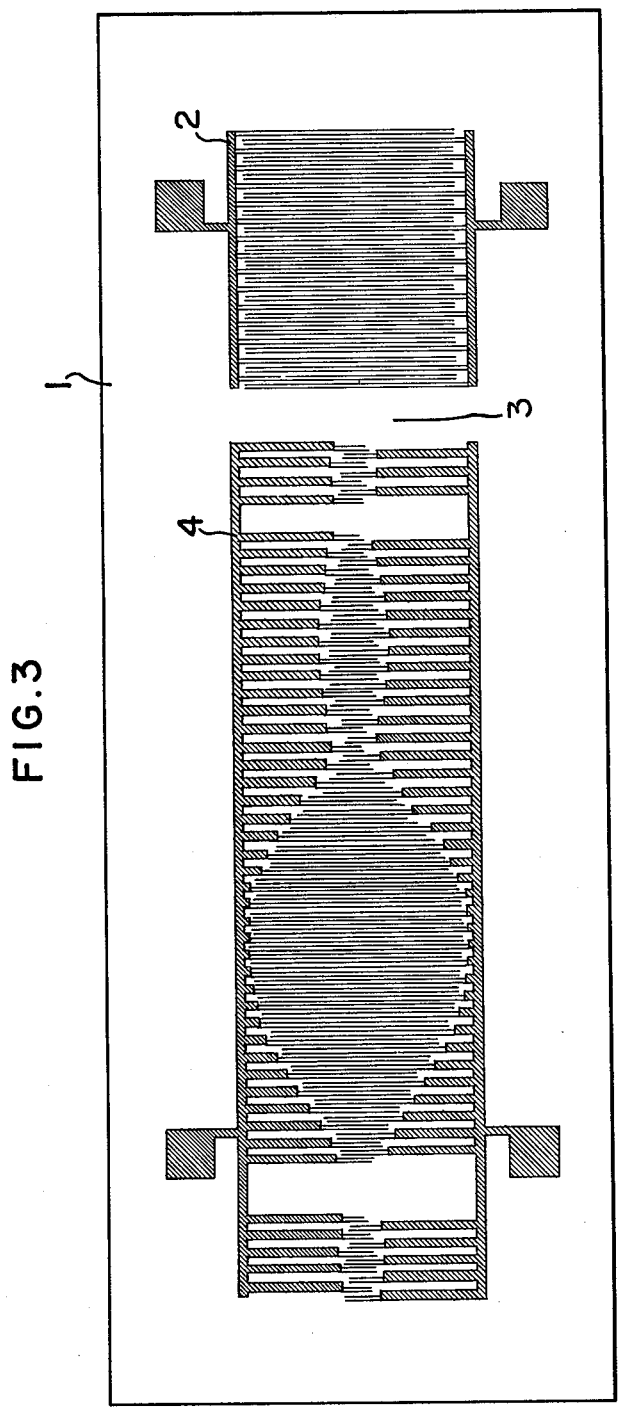
FIG. 3 shows a top view of a surface acoustic wave device of the present invention.

FIG. 3 is a top view of a surface acoustic wave device having a split-connected type electrode finger structure embodying the present invention, in which numeral 1 denotes a piezoelectric crystal substrate of lithium niobate ($LiNbO_3$), numeral 2 denotes an interdigital transducer which serves as an input electrode. It is a well known normal type input electrode. Numeral 3 denotes a propagation path for a surface acoustic wave and numeral 4 denotes an output electrode which is an overlap length weighted interdigital transducer. Where required, the input electrode may be a weighted interdigital transducer while the output electrode may be a normal type interdigital transducer, or both input and output electrodes may be weighted electrodes or weighted interdigital transducers.

Figure 4:
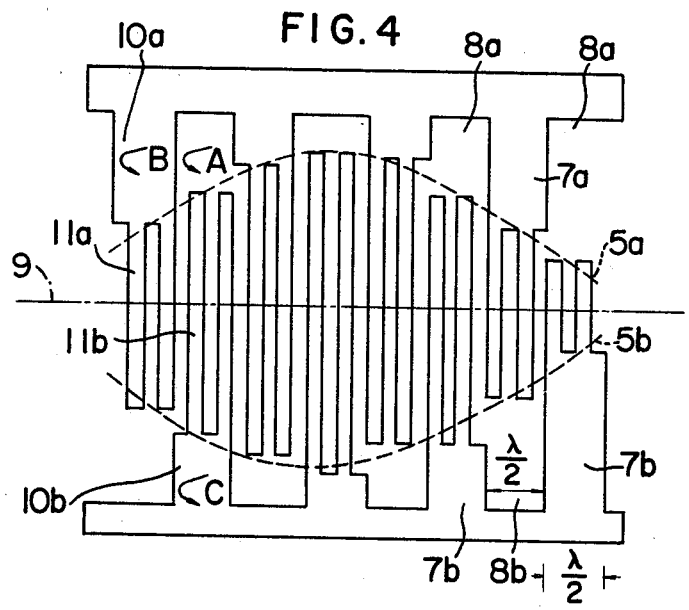
FIG. 4 shows a top view of a weighted interdigital transducer of the surface acoustic wave device of the present invention.

In the present embodiment, a chip size of the piezoelectric substrate 1 is 6 mm × 2 mm and the electrode fingers are of a split-connected type. FIG. 4 shows a top view illustrating the structure of the output electrode 4 shown in FIG. 3. In FIG. 4, numerals 10a and 10b denote comb-like electrode fingers overlapped with each other. Each of the electrode fingers 10a and 10b includes a first finger portion 7a or 7b and a second finger portion 11a or 11b. The first finger portions 7a and 7b do not contribute to generation or reception of a surface acoustic wave while the second finger portions 11a and 11b contribute to generation or reception of a surface acoustic wave. Each of the second finger portions 11a and 11b includes a pair of finger strips because the shown interdigital transducer is of a split-connected type. The width of these strips is one-eighth of the wavelength of the surface acoustic wave. Numerals 8a and 8b denote spaces existing between the first finger portions and numeral 9 denotes a center line of the propagation path of the surface acoustic wave. The dimensions of the split-connected type electrode fingers 11a and 11b are: second finger portion width 8.6 μm; distance between adjacent first finger portions measured widthwise thereof 8.6 μm; and the width of the first finger portions 34.4 μm.

As shown in FIG. 4, the width of the first finger portions 7a and 7b external of the envelopes 5a and 5b defined by the lengths of first and second finger portions of the electrode fingers 10a and 10b, which portions do not contribute to generation or the reception of the surface acoustic wave, is equal to one half of the wavelength λ of the surface acoustic wave and is 4 to 8 times as large as the width of the conventional split-connected type or unbalanced double electrodes. The lengths of the spaces 8a and 8b between adjacent first finger portions 7a and 7b external of the envelopes 5a and 5b which length is measured widthwise of the first finger portions 7a and 7b are equal to one half of the wavelength λ or equal to the width of the first finger portions 7a and 7b so that the ratio of the width of the first finger portions 7a, and 7b and the length of the space 8a, 8b measured widthwise of the first finger portions at which spaces no electrode finger is present is equal to unity. Each of the second finger portions 11a and 11b which are internal of the envelopes 5a and 5b and contribute to generation or reception of the surface acoustic wave includes a pair of finger strips as shown in FIG. 4. The overlapped comb-like electrode fingers 10a and 10b thus constructed are arranged such that the envelopes 5a and 5b are vertically substantially symmetrical about the center line 9 of the propagation path for the surface acoustic wave and the λ/2 width electrode portions, i.e., the second finger portions 7a, and 7b and the λ/2 width spaces 8a and 8b are in opposite positional relation to each other around the center line 9. The overlap length is weighted in accordance with the envelopes 5a and 5b.

Figure 1:
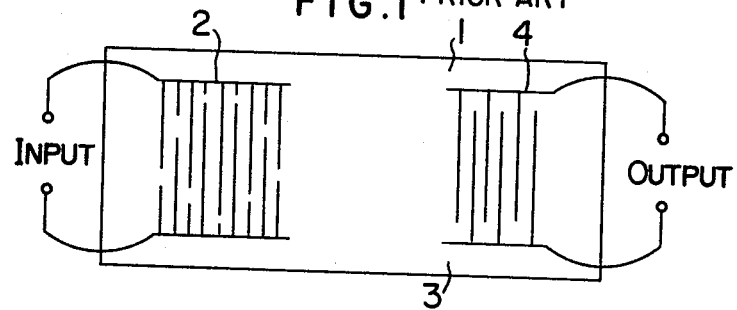
FIG. 1 is a top schematic view of a conventional surface acoustic wave device.
Figure 2:
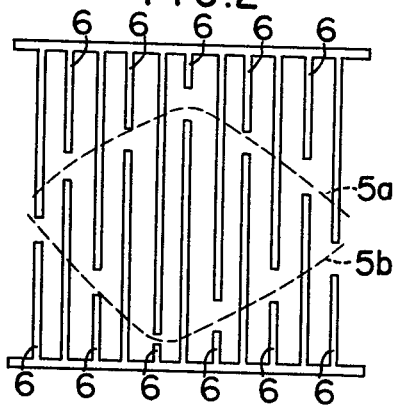
FIG. 2 is a top view of a weighted interdigital transducer of a prior art surface acoustic wave device.

Thus, in accordance with the interdigital transducer shown in FIG. 4, since the width of the first finger portions which do not directly contribute to generation or reception of the surface acoustic wave is 4 to 8 times as large as the conventional split-connected type or unbalanced double electrode, the breakage of the electrode fingers is considerably prevented and the production yield of the device is improved. Furthermore, since the ratio of the first finger portions 7a and 7b to the length of the spaces 8a and 8b measured widthwise of the first finger portions is equal to unity, occurrence of the wavefront distortion of the surface acoustic wave is prevented without necessitating dummy electrodes between the electrodes fingers, as is necessary in the structure of FIG. 2.

The reason why the reflection does not occur at the electrodes will now be explained. In FIG. 4, symbols A and B represent reflected waves at the spaces 8a and the first finger portions 7a, respectively. Since the width of the finger portions 7a is equal to λ/2, the reflected wave B has a differential path length of $(\lambda/2) \times 2 = \lambda$ or 360° with respect to the reflected wave A. Furthermore, since the reflected wave A is generated when the wave propagates from the space 7b to the first finger portion 7a while the reflected wave B is generated when the wave propagates from the first finger portion 7a to the space 7b, there is a phase difference of 180° between the reflected waves A and B. Consequently, the reflected waves A and B cancel each other. Furthermore, since the first finger portions 7a, 7b and the spaces 8a, 8b in opposite relation about the center line 9, a differential path length between the reflected waves A and C is equal to zero but the reflected wave A is generated when the wave propagates from the space 8a to the first finger portion 7a while the reflected wave C is generated when the wave propagates from the first finger portion 7b to the space 8b. Therefore, there is a phase difference of 180° between the reflected waves A and C and they cancel each other. In this manner, the reflected waves cancel each other in a dual way so that a suppression effect is enhanced.

As is seen from the above embodiment, in accordance with the present invention, the interdigital transducer is weighted in its overlap length such that the envelopes defined by the weighted overlap are symmetric about the center line of the propagation path of the surface acoustic wave, the width of the first finger portions of the comb-like electrode fingers which do not contribute to generation or reception of the surface acoustic wave and the length of the spaces between the first finger portions measured widthwise thereof are approximately equal to one-half of the wavelength of the surface acoustic wave, and the one-half wavelength width electrode portions, i.e., the first finger portions and the spaces are arranged in opposite positional relation about the center line of the propagation path of the surface acoustic wave. Consequently, the wavefront distortion of the surface acoustic wave in the interdigital transducer and the reflection at the electrode fingers are prevented and the production yield of the device is improved. Furthermore, since the width of the first finger portions of the interdigital transducer which do not contribute to generation or reception of the surface acoustic wave is 4 to 8 times as wide as the conventional electrodes, the breakage of the electrodes is prevented. Therefore, the present invention greatly contributes to the development of the device of this type.

Although in the above described embodiment an interdigital transducer having a split-connected type electrode finger structure is shown, the present invention may be applicable to an interdigital transducer having any other type electrode finger structure.

We claim:

1. A surface acoustic wave device comprising a piezoelectric substrate, first and second interdigital transducers each having a pair of comb-like electrode fingers overlapped with each other arranged on said substrate, and a propagation path between said first and second interdigital transducers on said substrate for propagating a surface acoustic wave, one of said first and second interdigital transducers converting an electric signal to a surface acoustic wave signal, the other interdigital transducer converting said surface acoustic wave signal to an electric signal, at least one of said first and second interdigital transducers having a weighted overlap length without dummy electrode fingers, wherein each of the electrode fingers of said at least one of said first and second interdigital transducers includes a first finger portion not contributing to generation or reception of said surface acoustic wave and a second finger portion contributing to generation or reception of said surface acoustic wave, lengths of said first and second finger portions defining said weighted overlap length, the envelopes defined by said weighted overlap length are substantially symmetric about the center line of said propagation path for said surface acoustic wave, the width of said first finger portions and the length of the spaces existing between adjacent first finger portions measured widthwise of said first finger portions are approximately equal to one-half of the wavelength of said approximately equal to one-half of the wavelength of said surface acoustic wave, and said first finger portions and said spaces between said first finger portions are in opposite positional relation about said center line of said propagation path of the surface acoustic wave.

2. A surface acoustic wave device according to claim 1, in which said second finger portion of each of the comb-like electrode fingers of said at least one interdigital transducers includes a pair of finger strips each having a width equal to one-eighth of the wavelength of said surface acoustic wave.

* * * * *